(12) United States Patent
Hatanaka et al.

(10) Patent No.: US 8,252,113 B2
(45) Date of Patent: Aug. 28, 2012

(54) METHOD FOR PRODUCING COMPONENT FOR VACUUM APPARATUS, RESIN COATING FORMING APPARATUS AND VACUUM FILM FORMING SYSTEM

(75) Inventors: Masanobu Hatanaka, Susono (JP); Yoshikazu Takahashi, Tsukuba (JP); Michio Ishikawa, Susono (JP); Fumio Nakamura, Susono (JP)

(73) Assignee: ULVAC, Inc., Kanagawa (JP)

( * ) Notice: Subject to any disclaimer, the term of this patent is extended or adjusted under 35 U.S.C. 154(b) by 891 days.

(21) Appl. No.: 11/886,600

(22) PCT Filed: Mar. 23, 2006

(86) PCT No.: PCT/JP2006/305832
§ 371 (c)(1),
(2), (4) Date: Oct. 22, 2008

(87) PCT Pub. No.: WO2006/101171
PCT Pub. Date: Sep. 28, 2006

(65) Prior Publication Data
US 2009/0238968 A1    Sep. 24, 2009

(30) Foreign Application Priority Data

Mar. 24, 2005  (JP) .................................. 2005-087200

(51) Int. Cl.
*C23C 16/00*  (2006.01)
*C23C 16/448* (2006.01)
*C23C 16/455* (2006.01)
*C23C 16/18*  (2006.01)
*C23C 16/06*  (2006.01)

(52) U.S. Cl. .......................... 118/715; 118/724; 118/726
(58) Field of Classification Search .................. 118/715, 118/724, 726
See application file for complete search history.

(56) References Cited

U.S. PATENT DOCUMENTS

| 4,663,201 | A | 5/1987 | House et al. |
| 2001/0006705 | A1* | 7/2001 | Takeshima ............... 427/255.28 |
| 2002/0007783 | A1* | 1/2002 | Hecken et al. ................ 118/105 |
| 2008/0026148 | A1* | 1/2008 | Tominaga et al. ....... 427/255.28 |
| 2008/0274627 | A1* | 11/2008 | Hamada et al. ............... 438/787 |
| 2009/0238968 | A1* | 9/2009 | Hatanaka et al. ............. 427/237 |
| 2009/0246538 | A1* | 10/2009 | Yamamoto et al. ........... 428/446 |

OTHER PUBLICATIONS

International Preliminary Examination Report on Patentability for PCT/JP2006/305832 issued Sep. 25, 2007, 5 pages.*
Japanese Pub. Hei 2-11768 Jan. 16, 1990 ULVAC Corp.
Japanese Pub. Hei 9-272703 Oct. 21, 1997 ULVAC Japan LTD.
Chinese Pub. 1356718 Jul. 3, 2002
Japanese Pub. 06-068151 Mar. 11, 1994 Fuji Xerox Co. LTD.
Japanese Pub. 09-255791 Sep. 30, 1997 ULVAC Japan LTD.

* cited by examiner

*Primary Examiner* — Jeffrie R Lund
(74) *Attorney, Agent, or Firm* — Carothers & Carothers

(57) ABSTRACT

The object of this invention is to provide a method for producing a component for vacuum apparatus and a resin coating forming apparatus capable of easily forming a resin coating on an internal flow path complex in shape.
The resin coating forming apparatus (21) comprises a monomer vapor supplying unit (23), a vacuum pumping line (24) for transporting monomer vapor, a connection portion (24c) connectable with the internal flow path of a component (22A) provided on part of the vacuum pumping line (24), and a temperature adjusting unit (31) for depositing the monomer vapor onto the internal flow path of the component (22A) connected with the connection portion (24c) to form a resin coating. The above arrangement permits the formation of a uniform, high-coverage resin coating on the internal flow path of the component (22A) by merely exposing the internal flow path to monomer vapor.

4 Claims, 6 Drawing Sheets

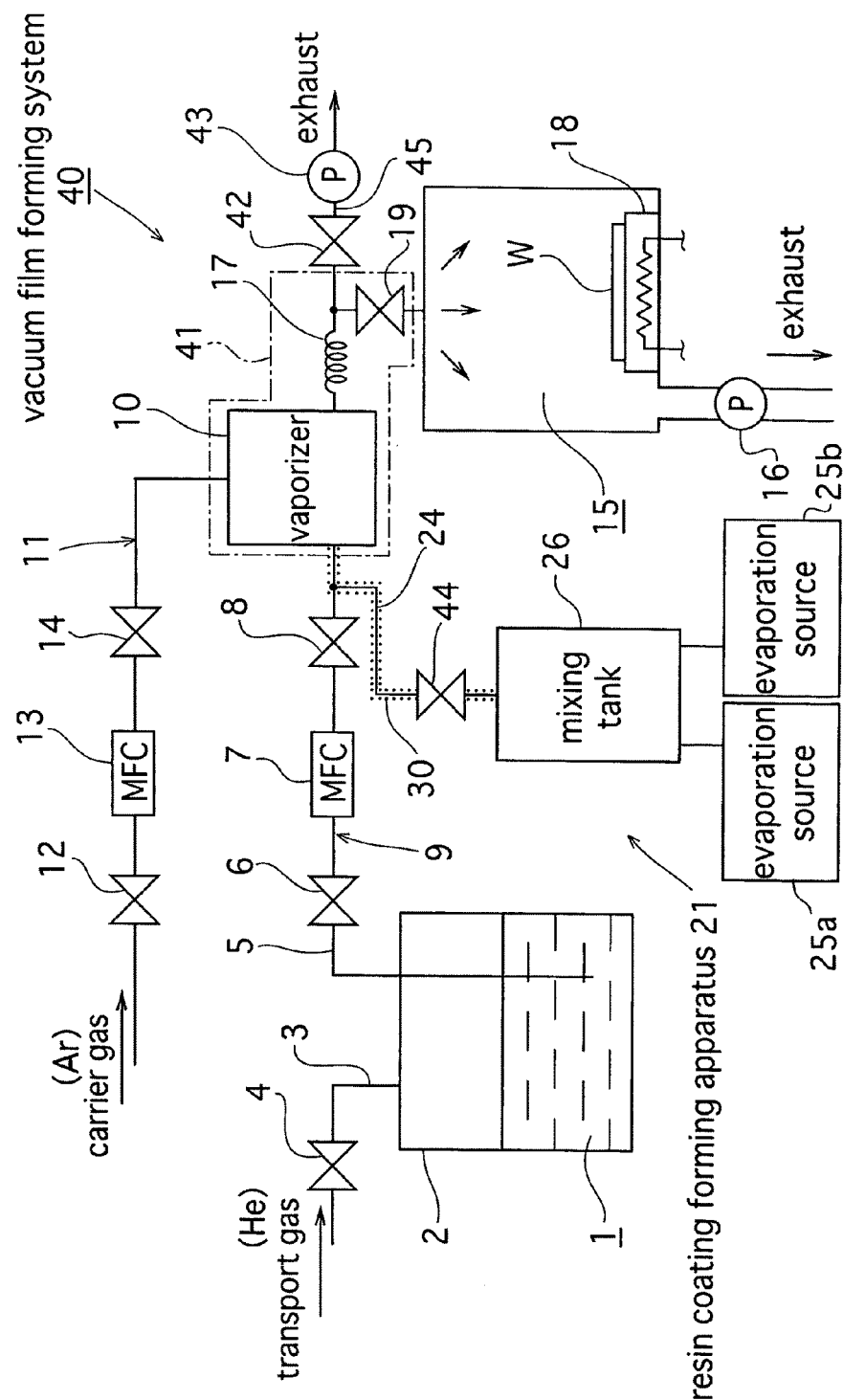

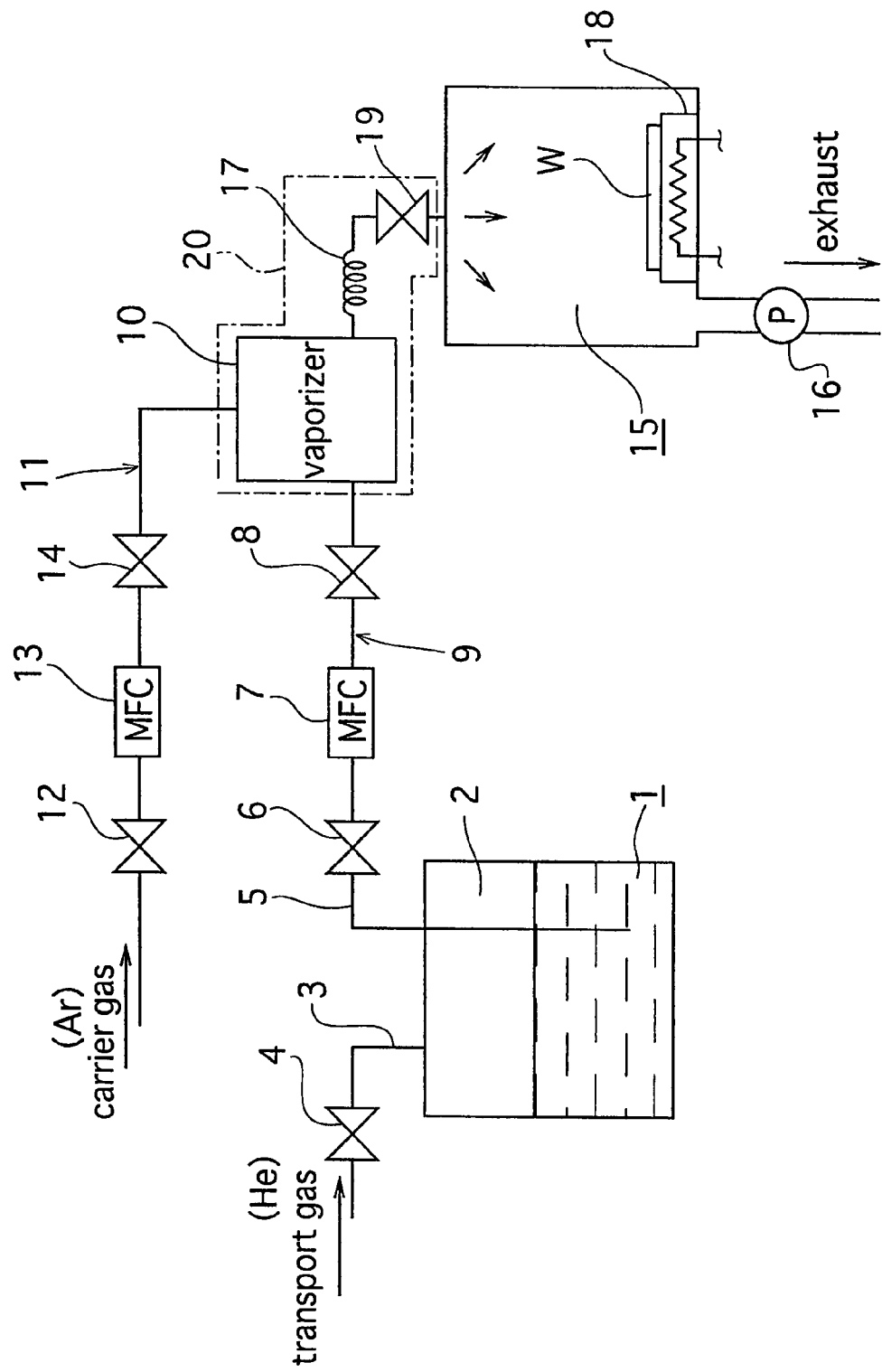

METHOD FOR PRODUCING COMPONENT FOR VACUUM APPARATUS, RESIN COATING FORMING APPARATUS AND VACUUM FILM FORMING SYSTEM

TECHNICAL FIELD

This invention relates to a method for producing a component for vacuum apparatus, a resin coating forming apparatus and a vacuum film forming system, for example, which protect a component such as a pipe member, a valve or a vaporizer of a vacuum film forming apparatus using a gas in which organic metal material is vaporized as a raw material, and by adhesion of the organic metal material, covers the internal flow path of the component with synthetic resin film.

BACKGROUND OF THE TECHNIQUE

The MOCVD (Metal Organic Chemical Vapor Deposition) method is a vacuum film forming technique which forms a thin film on a substrate by the heat decomposition of organic metal gas having high reactivity, or by the direct reaction of the organic metal gas with other gas. The MOCVD method is expected to be applied to the electronics field including metal circuit layer forming technique.

FIG. 5 shows a schematic view of a source gas supply line of a prior art MOCVD apparatus.

Organic metal complex in the liquid state (liquid raw material) 1 is stored in a closed vessel 2. A gas feed line 3 for pneumatic transportation is connected with the closed vessel 2. A transport gas, for example helium (He), is introduced into the closed vessel 2 through a valve 4. A delivery line 5 is connected with the closed vessel 2. The liquid raw material 1 is delivered to the outside of the closed vessel 2 through the delivery line 5 by introducing the transport gas into the closed vessel 2. The delivery line 5 is connected to a vaporizer 10 through a liquid raw material feed line 9 which comprises a valve 6, a mass flow controller (MFC) 7 and a valve 8.

The vaporizer 10 is vacuum equipment (component for vacuum apparatus) which vaporizes the liquid raw material 1 supplied through the liquid raw material feed line 9 and then forms a source gas by mixing the liquid raw material and a carrier gas such as argon (Ar). The carrier gas is supplied to the vaporizer 10 through a carrier gas feed line 11 which comprises a valve 12, a mass flow controller (MFC) 13 and a valve 14.

A pipe member 17 and a valve 19 are connected between the vaporizer 10 and a reaction chamber (film forming chamber) 15. The source gas formed by the vaporizer 10 is introduced into the reaction chamber 15 through the pipe member 17 and the valve 19. The vaporizer 10, the pipe member 17 and the valve 19 are heated at a predetermined temperature with heating unit 20 for vaporizing the raw material.

A part of or the whole of the pipe member 17 is coil shaped so as to be able to transform elastically when joining the valve 19 to the vaporizer 10, so that the joining operation of these members becomes easy. Accordingly, not only this pipe member 17 but also the other pipe members, such as the liquid raw material feed line 9 and the carrier gas feed line 11, can adopt a similar construction.

The reaction chamber 15 is depressurized at a predetermined degree of vacuum with a vacuum pump 16. A stage 18 having a heater for heating a substrate W to be processed, such as a semiconductor wafer or a glass substrate for liquid crystal device, is installed in this reaction chamber 15. In the reaction chamber 15, the source gas is decomposed by reacting with a reaction gas such as ammonia or hydrogen which is introduced into the reaction chamber 15 simultaneously, and then a metal layer is formed on the substrate W.

Many of the organic metal materials for forming a film by the MOCVD method are typically in a liquid or solid state at room temperature (25.). Accordingly, when organic metal material is used as raw material for chemical vapor deposition (CVD) or atom layer deposition (ALD), pipelines for transporting vaporized metal organic material and valves are held at a temperature higher than room temperature (refer to Patent Document 1).

Patent Document 1: JP2001-11631A
Patent Document 2: JP 4-341559A

DISCLOSURE OF INVENTION

Problem to be Solved by the Invention

However, the conventional MOCVD apparatus has a problem in that mists of the source gas adhere onto the inner surface of the source gas feed line including the vaporizer 10, the pipe member 17 and the valve 19 because the source gas is heated for a considerable time, so that the deposition material is deposited thereon. For example, FIG. 6 shows a SEM photograph of the decomposition product of the source gas which is deposited on the inner surface of a pipe member made of stainless steel. In the figure, the area indicated in white presents the decomposition product of the source gas.

In the raw material for which the decomposition temperature and the vapor pressure are both low, the above problem occurs easily. In this case, some dust is generated and the deposition rate becomes unstable by fluctuation of the source gas supply. Therefore, the source gas feed line needs to be regularly cleaned or exchanged. Because of this, productivity improvement cannot be obtained.

For preventing the adhesion of a raw material, the passivation process for the inner surface of the source gas feed line with fluorine or chromium oxide, or the coating process onto the inner surface of the source gas feed line with synthetic resin is considered. However, according to the passivation process to the inner surface of the source gas feed line, the probability that the raw material adheres becomes adversely higher when material which is easy to be coupled with halogen material such as fluorine, or metal such as chrome, is used as the raw material.

In contrast, coating the inner surface of the source gas feed line with synthetic resin such as the fluororesin, which is called lining, is useful. Thermal spraying, spread coating or fluidizing coating is common for forming a resin coating. However, these coating techniques cannot be applied to the vacuum components which have complicated internal flow path shapes, such as coil shaped or S-shaped pipe members, vaporizers and valves.

Further in these coating techniques for forming a synthetic resin coating, it is difficult to control the thickness of the resin coating (more than dozens of µm at the smallest), and the uniformity of the thickness cannot be secured. Therefore there is the problem that it cannot apply to a component for vacuum apparatus, such as vaporizers and valves, having internal flow path or paths that need a thin and uniform coating thickness.

This invention was made in consideration of the above problems. It is an object of this invention to provide a method for producing a component for vacuum apparatus and a resin coating forming apparatus which can easily and thinly form the resin coating to the inner flow path having a complicated shape.

Further, it is another object of this invention to provide a vacuum film forming system which can prevent the deposition material from adhering onto a source gas feed line and can reduce dust and can stably supply a source gas to a reaction chamber.

SUMMARY OF THE INVENTION

To solve the above objects, a method for producing a component for vacuum apparatus, having an internal flow path, comprises the steps of:
connecting the internal flow path to a vacuum pumping line;
supplying a monomer vapor through the vacuum pumping line to the internal flow path; and
forming a resin coating on the internal flow path.

When the internal flow path of the component is connected with the vacuum pumping line, it constitutes a part of a transport line of the monomer vapor together with the vacuum exhaust line. The monomer vapor is contacted with the whole surface of the internal flow path of the component and is deposited thereon. Therefore, a uniform resin coating is formed on the surface of the internal flow path.

According to this invention, the resin coating can be formed in uniformity and with high coverage characteristics onto the internal flow path by means of exposing the internal flow path to the monomer vapor. Further, it is easy to control the thickness of the resin coating. For example, a thin coating of 10 nm to 50 nm can be formed with high accuracy.

The resin coating can be formed selectively onto the internal flow path of the component by holding the vacuum pumping line, except the internal flow path, at a temperature higher than the gasification temperature of the synthetic resin raw material monomer. The thickness of the resin coating can be controlled by adjusting the pressure, the flow rate of the monomer vapor, the deposition time or the temperature of the component.

Further still, the resin coating can be formed collectively onto the internal flow paths of a plurality of components by connecting the components serially with the vacuum pumping line.

As for the monomer vapor, not only is the vapor of a single resin raw material monomer preferable, but also a mixed vapor of plural resin raw material monomers is also preferable. The kind of resin coating to be formed can be chosen appropriately depending on the kind of ground layer material and organic metal material that is to be prevented from being deposited. As an example of the resin coating, when polyurea film, polyamide film or polyimide film is formed, a mixed vapor of two kinds of monomers for vapor deposition polymerization is preferred.

A plurality of evaporation sources may be installed depending on the kinds of the raw material monomers to be used and embodiments of the usage. For example, when two kinds of raw material monomers are used, two evaporation sources can be installed so as to correspond to the number of the monomers. Further, one kind of raw material monomer may be vaporized in plural evaporation sources, and two kinds of raw material monomers may be vaporized in one common evaporation source.

On the other hand, a resin coating forming apparatus of this invention comprises:
a supply unit supplying a monomer vapor;
a vacuum pumping line transporting the monomer vapor;
a connection portion provided on part of the vacuum pumping line and connectable with a an internal flow path of a component for the vacuum apparatus; and
a temperature adjusting unit for forming a resin coating by depositing the monomer vapor onto the internal flow path connected to the connection portion.

The resin coating forming apparatus can be combined to a source gas feed line of a vacuum film forming apparatus such as a MOCVD apparatus. In this case, the resin coating can be easily formed inside the source gas feed line, and a generation of particles caused by adhesion of organic metal material and a fluctuation of the source gas supply can be prevented.

Effect of the Invention

According to this invention, the resin coating for preventing adhesion of a source gas for deposition can be easily formed onto the internal flow paths having complicated shapes for the vacuum components, such as coil shaped or S-shaped pipe members, valves and vaporizers.

Further, according to this invention adhesion of the source gas onto the source gas feed line can be prevented, whereby a vacuum film forming system in which the generation of dust is restrained and the source gas is supplied in stability to a reaction chamber, can be obtained.

BRIEF DESCRIPTION OF THE DRAWINGS

FIG. 3 is a schematic view of a vacuum film forming system 40 according to a second embodiment of this invention;

FIG. 5 is a schematic view of a source gas feed line of a prior art MOCVD apparatus.

| [Explanations of letters or numerals] | |
|---|---|
| 10 | vaporizer |
| 17 | source gas feed line |
| 21 | resin coating forming apparatus |
| 22A, 22B | component for vacuum apparatus |
| 23 | supply unit |
| 24 | vacuum pumping line |
| 24c | connection portion |
| 25a, 25b | evaporation source |
| 26 | mixing tank |
| 31 | temperature adjusting unit |
| 40 | vacuum film forming system |
| 41 | temperature adjusting unit |

BEST EMBODIMENT OF INVENTION

Each of the embodiments of this invention will be described with reference to the drawings.

First Embodiment

Figure 1:
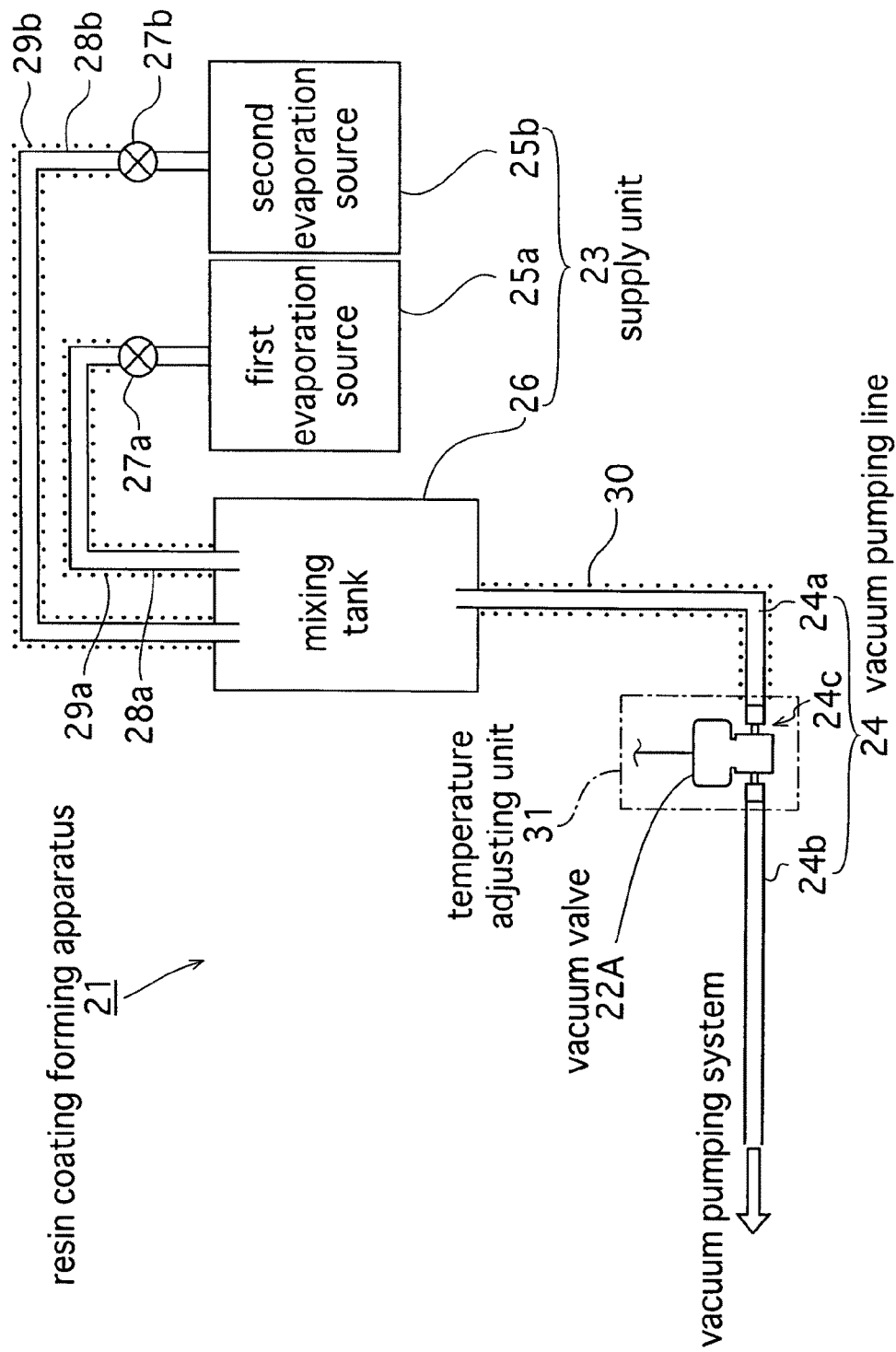
FIG. 1 is a schematic view of a resin coating forming apparatus according to a first embodiment of this invention.

FIG. 1 shows a schematic view of a resin coating forming apparatus 21 according to a first embodiment of this invention. The resin coating forming apparatus 21 of this embodiment is for forming a resin coating onto an internal flow path of a component 22A (vacuum valve in the example of FIG. 1) for the vacuum apparatus.

The resin coating forming apparatus 21 has a vacuum pumping line 24 of which one end communicates with a vacuum pump (not shown) and another end connects with a supply unit 23 which supplies a monomer vapor for forming the resin coating. The vacuum pumping line 24 has a first pipeline 24a on the upstream side (supply unit 23 side) and a second pipeline 24b on the downstream side (vacuum pump side). The vacuum valve 22A is connected with a connection portion 24c arranged between the first and second pipelines 24a, 24b.

The vacuum valve 22A is an air operation valve of the normally closed type which opens the internal flow path when pneumatics is introduced, and is tightly connected with each of the ends of the first and second pipelines 24a, 24b. Therefore, the internal flow path of the vacuum valve 22A constitutes a part of the vacuum pumping line 24, and the monomer vapor supplied from the supply unit 23 through the first pipeline 24a can flow towards the second pipeline 24b side through the vacuum valve 22A.

The supply unit 23 generates raw material monomer vapor of the resin coating (polyurea film in this embodiment) to be formed onto the internal flow path of the vacuum valve 22A connected with the vacuum pumping line 24, and supplies the generated monomer vapor to the vacuum pumping line 24.

In this embodiment, the supply unit 23 has a first a second evaporation sources 25a, 25b which generate resin raw material monomers for vapor deposition polymerization, and a mixing tank 26 for mixing monomer vapors generated from the first and second evaporation sources 25a, 25b. The first evaporation source 25a is charged with aromatic diamine monomer such as 4,4'-methylenedianiline (MDA). The evaporation source 25a heats the monomer and generates MDA monomer vapor. The second evaporation source 25b is charged with an aromatic diisocyanate monomer such as diphenyl-methane diisocyanate (MDI). The evaporation source 25b heats the monomer and generates MDI monomer vapor. The first and second evaporation sources 25a, 25b are connected with the mixing tank 26 through introduction valves 27a, 27b and introduction pipelines 28a, 28b, respectively.

Heaters 29a, 29b, 30 are installed around the introduction pipelines 28a, 28b and the upstream pipeline 24a of the vacuum pumping line 24, respectively. These pipelines are held at a temperature higher than the gasification temperature of the raw material monomer. The temperatures of the heaters 29a, 29b, 30 are set to 170° C., for example. Also, a heating mechanism such as a heater for the mixing tank 26 is installed. As above described, the introduction pipelines 28a, 28b, the mixing tank 26 and the pipeline 24a constitute a transport line for the monomer vapor.

The vacuum valve 22A is constructed so as that the temperature of the internal flow path can be freely adjusted with a temperature adjusting unit 31 for forming a film onto the internal flow path by adhesion of the mixed monomers vapor. The temperature adjusting unit 31 is constructed by an oven or a heater which can adjust the temperature of the vacuum valve within a room temperature to 150° C., more preferably, 60° C. to 120° C. The resin coating (polyurea film) is selectively formed onto the internal flow path of the vacuum valve 22A by adjusting the temperature of the internal flow path with the temperature adjusting unit 31.

Next, operation of the resin coating forming apparatus 21 of this embodiment will be described.

At first, the vacuum valve 22A is connected with the connection portion 24c of the vacuum pumping line 24. Afterward, the vacuum valve 22A is opened by introducing a pneumatics. A Vacuum pump (not shown) is driven, whereby the vacuum pumping line 24 and the supply unit 23 are evacuated to a predetermined pressure (for example, $1.0 \times 10^{-3}$ Pa or less).

Next, the first and second evaporation sources 25a, 25b heat the raw material monomers and generate the monomer vapors. In this embodiment, an MDA for which the melting point is 91° C., is heated to a temperature of 115±1° C. in the first evaporation source 25a, and the MDI for which the melting point is 39° C., is heated to a temperature of 85±1° C. in the second evaporation source 25b. Generated monomer vapors are supplied to the mixing tank 26 through the introduction valves 27a, 27b and the introduction pipelines 28a, 28b heated at a predetermined temperature (170° C.), and are mixed with each other in the mixing tank 26 heated at a temperature of 50±1° C.

The mixed monomers vapor produced in the mixing tank 26 is led out to the vacuum pumping line 24. The internal flow path of the vacuum valve 22A in the opened state and constitutes a part of the vacuum pumping line 24, whereby the mixed vapor passes the vacuum valve 22A and the downstream pipeline 24b through the upstream pipeline 24a heated at a predetermined temperature (170° C.), and is finally exhausted.

By the temperature adjusting unit 31, the vacuum valve 22A is held at a range of temperature (for example, 60 to 120° C.) at which the monomer can adhere onto the internal flow path. Therefore, two kinds of monomers adhere onto the internal flow path of the vacuum valve 22A and the polymerization reaction occurs between the two monomers, and then a polyurea film is formed on the internal flow path. The thickness of the polyurea film is easily controlled by parameters such as the preset temperature of the vacuum valve 22A and the feed period of the monomer vapor.

In this embodiment, the thickness of the polyurea film is from 100 nm to 1000 nm. When the thickness is less than 100 nm, it is not enough to cover the unevenness of the ground layer surface constituting the internal flow path. When the thickness is more than 1000 nm, it is so thick that there is the fear that the defect of opening or closing motion of the valve occurs.

The thickness of the polyurea film can be changed depending on the kind or the specification of the vacuum valve. For example, when surface treatment such as electrolytic polishing processing is made on the surface of the ground metal material constituting the internal flow path, the thickness of the film can be equal to 100 nm or less. Further, when the shape of the internal flow path is constant, as a straight pipe member, the thickness of the film can be equal to 1000 nm or more.

As above described, according to this embodiment the resin coating is easily formed onto the internal flow path of the vacuum valve 22A by merely exposing the internal flow path to the monomer vapor. Further, the thickness of the resin coating can be thinned and thickness control is easy. Further still, high uniformity can be secured because the resin coating can be formed on the whole surface with which the monomer vapor contacts. The resin coating can be formed selectively only on the internal flow path without dismantling the valve, even if the shape of the internal flow path is complicated.

Further, polyurea film can be formed at the low-temperature, comparatively. Therefore, this embodiment can be applied not only to the component having high heat resistance but also to the component including an element that heat resistance is low, such as an O-ring seal.

The vacuum valve 22A that the polyurea film is formed onto in the internal flow path by the above resin coating forming apparatus 21 can be applied to a component of a source gas feed line for a film forming apparatus such as MOCVD apparatus. The internal flow path of the vacuum valve 22A is covered with the polyurea film. Therefore, when a precursor made of organic metal compound such as MPA (1-methylpyrrolidine Alane) is used as source material, the source material can be effectively prevented from adhering to the internal flow path of the vacuum valve 22A. Accordingly, the generation of particles (dust) caused by adhesion of deposition material for CVD on the internal flow path and the fluctuation of the source gas supply can be prevented, and furthermore, the film forming process can be stably secured.

After the internal flow path of the vacuum valve 22A is covered with the polyurea film by the resin coating forming apparatus 21, the internal flow path will be exposed to air until it is built in to the film forming apparatus. In this case, impurities such as moisture content in the air adhere to the formed polyurea film. In order to remove the impurities, preferably, the vacuum valve (internal flow path) 22A is heated to a predetermined temperature, thereby the polyurea film is baked before the film forming process after assembling in the vacuum valve to the film forming apparatus.

When the vacuum valve 22A is used for a long time, the resin coating formed inside the valve will be deteriorated or worn out, so that a need for exchange of the valve will be required. The resin coating forming apparatus 21 can regenerate the resin coating. In this case, at first the vacuum valve 22A is disassembled from the source gas feed line of the film forming apparatus and then the polyurea film formed onto the internal flow path is decomposed and removed with a solvent cleaner and heat treatment.

As the solvent cleaner for removing the polyurea film, a solution including one or more selected from a group consisting of phosphoric acid ($H_3PO_4$), nitric acid ($HNO_3$), hydrochloric acid (HCl), sulfuric acid ($H_2SO_4$), fluorinated acid (HF) and hydrogen peroxide water ($H_2O_2$), can be used. Also, the heating temperature needed to remove the polyurea film is 260° C. or more because the depolymerization temperature of polyurea is 260° C. The used vacuum valve 22A is cleaned with the solvent cleaner and pure water, and is heated at a temperature of 260° C. or more, and then extraneous material and the polyurea film adhered on a surface of the internal flow path are removed. The cleaned vacuum valve is connected with the vacuum pumping line 24 of the resin coating forming apparatus 21 and then a polyurea film is newly formed onto the internal flow path in the above manner.

As a result of measuring amounts of leak and particle on a vacuum valve after forming the polyurea film on the internal flow path by using the resin coating forming apparatus 21, it was verified to be able to secure a quality similar to the quality of a valve before forming a polyurea film.

The vacuum valves used for the experiment were air operation valves of the diaphragm type (wherein "2LDS-8C-FV-P" (two-port connection valve) was one of them and "2LDT-8C-FV-P" (three-port connection valve) was another of them, which are respectively produced by MOTOYAMA ENG. WORKS. LTD.). The thickness of the polyurea film was equal to 200 nm. The leak test and the particle test were based on a general delivery inspection of valve makers. As a result of the tests, it was determined which sample was at an acceptable level.

As for the resin coating formed on the internal flow path of the vacuum valve 22A, even other synthetic resin coatings such as a polyimide film or a polyamide film is preferable as well as a polyurea film. For example, when a polyimide film is formed, the internal flow path of a vacuum valve is exposed to a mixed vapor that is mixed with a monomer vapor of pyromellitic dianhydride (PMDA) and a monomer vapor of 4,4'-methylenedianiline (MDA). Also in this case, the above resin coating forming apparatus 21 can be used. Polyimide is produced by curing a polyimide precursor within the range of 200 to 300° C. after producing the precursor polymerized at a range of 80 to 200° C. In this case, the temperature adjusting unit 31 should be set up in the temperature ranges of these two phases.

Figure 2:
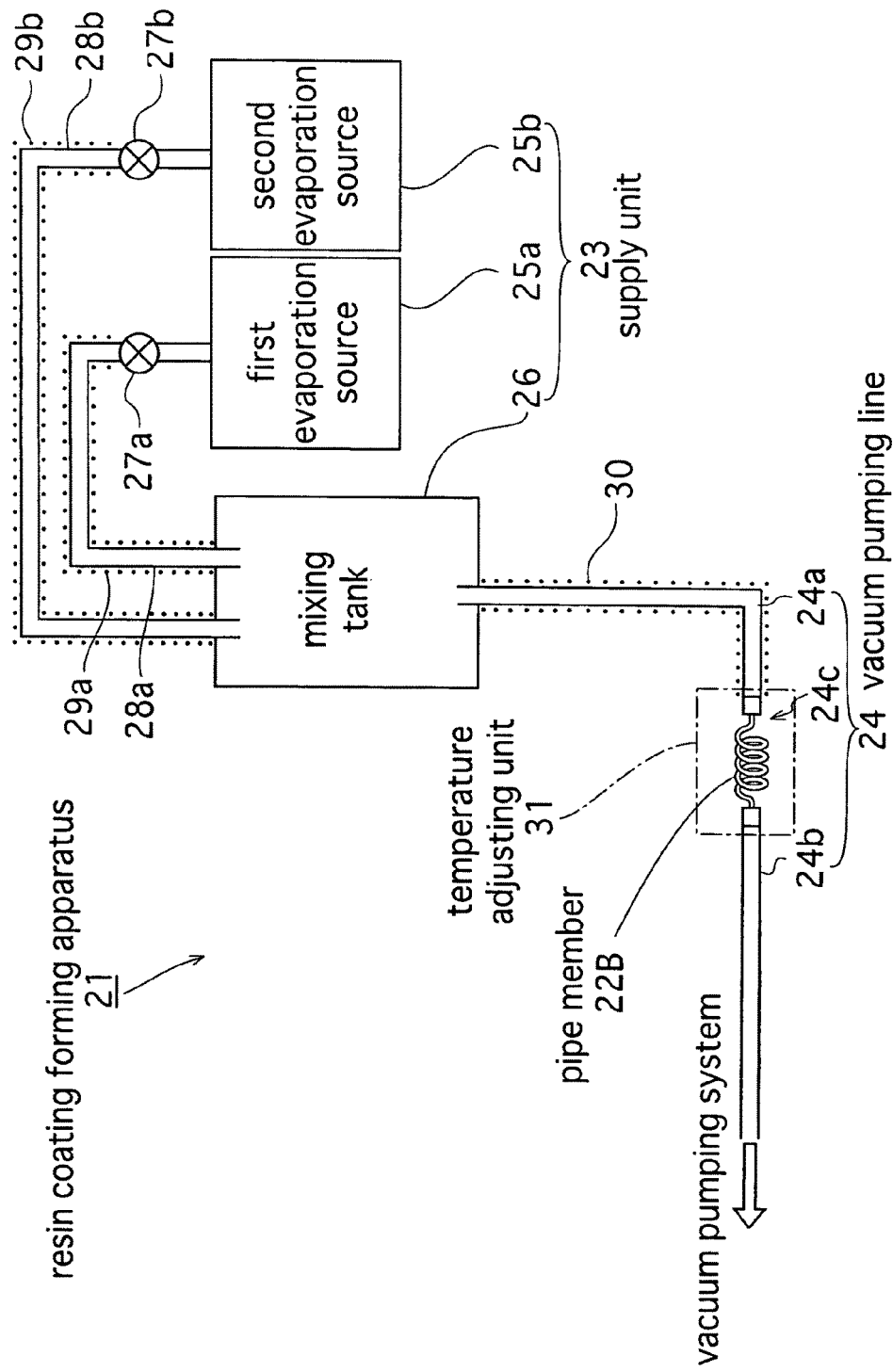
FIG. 2 is one modification of the first embodiment of this invention.

Further, the component pertaining to this invention is not restricted to the vacuum valve 22A. For example as shown in FIG. 2, it can apply to a pipe member 22b that has an internal flow path which is coil shaped or S-shaped. In FIG. 2, parts that correspond to those in FIG. 1, are denoted by the same reference numerals, the detailed description of which will be omitted.

According to the embodiment shown in FIG. 2, a polyurea film having a desired thickness can be formed by connecting the pipe member 22B with the connection portion 24c of the vacuum pumping line 24 and supplying a mixed vapor that is mixed with two kinds of monomers of MDA and MDI generated in the supply unit 23 to the inside of the pipe member 22B. The resin coating having a constant thickness can be formed on the internal flow path of the pipe member 22B regardless of the pipe shape.

Second Embodiment

FIG. 3 shows a second embodiment of this invention. In this embodiment, a vacuum film forming system will be described. The vacuum film forming system consists of a combination of the resin coating forming apparatus 21 with a conventional MOCVD apparatus as shown in FIG. 5. In FIG. 3, parts that correspond to those in FIG. 5, are denoted by the same reference numerals, the detailed description of which will be omitted.

Organic metal complex in the liquid state (liquid raw material) 1 as the source material for film forming is stored in a closed vessel 2. A gas feed line 3 for pneumatic transportation is connected with the closed vessel 2. A transport gas, for example helium (He), is introduced into the closed vessel 2 through a valve 4. A delivery line 5 is connected with the closed vessel 2. The liquid raw material 1 is derived to the outside of the closed vessel 2 through the delivery line 5 by introducing the transport gas into the closed vessel 2. The delivery line 5 is connected to a vaporizer 10 through a liquid raw material feed line 9 which comprises a valve 6, a mass flow controller (MFC) and a valve 8.

The vaporizer 10 is a vacuum equipment (component for vacuum apparatus) which vaporizes the liquid raw material 1 supplied through the liquid raw material feed line 9 and then forms a source gas by mixing the liquid raw material and a carrier gas such as argon (Ar). The carrier gas is supplied to the vaporizer 10 through a carrier gas feed line 11 which comprises a valve 12, a mass flow controller (MFC) 13 and a valve 14.

A pipe member 17 and a valve 19 are connected between the vaporizer 10 and a reaction chamber (film forming chamber) 15. The source gas formed by the vaporizer 10 is introduced into the reaction chamber 15 through the pipe member 17 and the valve 19. A source gas feed line pertaining to the present invention is composed of the vaporizer 10, the pipe member 17 and the valve 19, which are heated at a predetermined temperature with heating unit 41 for vaporizing the raw material.

A part of or the whole of the pipe member 17 is coil shaped so as to be able to transform elastically when joining the valve 19 to the vaporizer 10, so that the joining operation of these parts becomes easy. Accordingly, not only this pipe member 17, but also the other pipe members, such as the liquid raw material feed line 9 and the carrier gas feed line 11 can adopt a similar construction.

The reaction chamber 15 is depressurized at a predetermined degree of vacuum with a vacuum pump 16. A stage 18 having a heater for heating a substrate W to be processed, such as a semiconductor wafer or a glass substrate for liquid crystal device, is installed in this reaction chamber 15. In the reaction chamber 15, the source gas is decomposed by reacting with a reaction gas such as ammonia or hydrogen which is introduced into the reaction chamber 15 simultaneously, and then a metal layer is formed on the substrate W.

The vacuum film forming system 40 of this embodiment is constituted by incorporating the resin coating forming apparatus 21 in the source gas feed line of the above mentioned MOCVD apparatus. Each of the parts of the resin coating forming apparatus 21 shown in FIG. 3 are denoted by the same reference numerals.

The resin coating forming apparatus 21 is for the purpose of forming a polyurea film onto the respective internal flow paths of the vaporizer 10, the pipe member 17 and the valve 19, which constitute the source gas feed line. The resin coating forming apparatus 21 comprises the first evaporation source 25a for generating MDA monomer vapor, the second evaporation source 25b for generating MDI monomer vapor and the mixing tank 26 for forming a mixed monomers vapor of the two kinds.

The mixing tank 26 is connected between the valve 8 and the vaporizer 10 on the liquid raw material feed line 9, through the vacuum pumping line 24 including the valve 44. The vacuum pumping line 24 is heated with heater 30 at a temperature higher than the gasification temperatures of the raw material monomers.

The vaporizer 10, the pipe member 17 and the valve 19 are heated with the heating unit 41 as a temperature adjusting unit, at a temperature (for example 60 to 120° C.) that can adhere the monomer thereby forming a polyurea film onto these internal flow paths.

A monomer vapor transport line pertaining to the present invention is composed of the vacuum pumping line 24 and the source gas feed line.

Further, a exhaust line 45 for exhausting the monomer vapor fed to the source gas feed line, towards the outside of the apparatus, is connected between the pipe member 17 and the valve 19. The exhaust line 45 comprises a valve 42 and is connected with a vacuum pump 43.

As for the vacuum film forming system 40 of this embodiment, the process for covering the source gas feed line with the polyurea film is carried out previous to the film forming process for the substrate W in the reaction chamber 15.

In the forming process of the polyurea film, the valves 8, 14, 19 are closed, and the valves 42, 44 are opened. Next, the monomer vapor feed line 24 is evacuated by driving a vacuum pump 43. Afterwards, MDA and MDI are evaporated in the evaporation sources 25a, 25b, and a mixed raw material monomers vapor for forming polyurea is formed in the mixing tank 26, and then the mixed vapor is supplied to the source gas feed line. The mixed monomers vapor passes through the vaporizer 10 and the pipe member 17 and the polyurea film is formed onto the internal flow paths of these parts. The leftover of the mixed vapor is exhausted to the outside of the apparatus through the exhaust line 45.

Further, the polyurea film can be formed into not only the vaporizer 10 and the pipe member 17 but also the internal flow path of the valve 19 by exhausting the mixed monomers vapor through the reaction chamber 15.

As above described, the resin coating made of the polyurea film is formed in the source gas feed line. Afterwards, the valves 42, 44 are closed and the valves 8, 14, 19 are opened. Then, the film forming process for the substrate W is carried out in the reaction chamber 15.

According to this embodiment, the polyurea film can be formed onto the internal flow paths of the components such as the vaporizer 10, the pipe member 17 and the valve 19 without disassembling these components from the source gas feed line. Further, the polyurea film can be respectively formed into a plurality of the components as a whole and thereby the operation stopping time of the vacuum film forming apparatus can be shortened.

EXAMPLE

Next, examples of this invention will be described.

Inventors of this invention carried out experiments regarding effects preventing MPA from adhering on a polyurea film and a polyimide film, respectively. The experiment was carried out with a procedure that includes the steps of treating the surface of chips made of SUS316L of 1 cm×1 cm with electrolytic polishing or coating, and putting these chip samples on a hot plate (70.) installed in a reaction chamber, and exposing them to MPA gas in succession for ten hours, and then measuring a variation of weight of every sample by using a microbalance and defining the variation as mass of deposition of MPA.

Afterwards the experiment was carried out with a procedure that includes the steps of taking SEM pictures of the samples, and inspecting these SEM pictures by visual observation, and deciding quality of these samples based on the visual inspection. MPA adhered on the samples precipitates on the surfaces of the samples and presents cloudy aspects on the SEM pictures. The decision of the quality was made on the basis of the measured deposition mass of MPA.

As SUS316L chips for the experiment, a bare sample treated with a machine, and a sample treated with electrolytic polishing, and samples covered with a TiN (titanium nitride) film, a polyurea film and a polyimide film were used. Furthermore, a sample made of Ni (nickel) of 1 cm×1 cm was used, in addition to the sample of SUS316L. A result of the experiment is shown in Table 1.

TABLE 1

|  | before testing (mg) | after testing (mg) | difference (mg) | visual inspection | decision |
| --- | --- | --- | --- | --- | --- |
| SUS316L (no coating) | 709.84 | 709.93 | 0.08 | light cloudiness | X |
| SUS316L-EP (no coating) | 796.26 | 796.32 | 0.06 | light cloudiness | Δ |

TABLE 1-continued

|  |  |  | before testing (mg) | after testing (mg) | difference (mg) | visual inspection | decision |
|---|---|---|---|---|---|---|---|
| Ni (no coating) |  |  | 1737.56 | 1738.85 | 1.29 | cloudiness | X |
| TiN film on SUS316L | 2 | μm | 708.38 | 708.36 | 0.38 | cloudiness | X |
| polyurea film on SUS316L | 50 | nm | 750.73 | 750.81 | 0.04 | light cloudiness | Δ |
|  | 100 | nm | 744.69 | 745.73 | 0.04 | light cloudiness | Δ |
|  | 300 | nm | 750.49 | 750.45 | 0.02 |  | ○ |
|  | 1000 | nm | 745.80 | 745.80 | 0 |  | ○ |
| polyimide film on SUS316L | 50 | nm | 802.90 | 802.92 | 0.02 |  | ○ |
|  | 80 | nm | 802.50 | 802.52 | 0.02 |  | ○ |
|  | 630 | nm | 804.36 | 804.36 | 0 |  | ○ |
|  | 1000 | nm | 797.43 | 797.43 | 0 |  | ○ |

Figure 6:
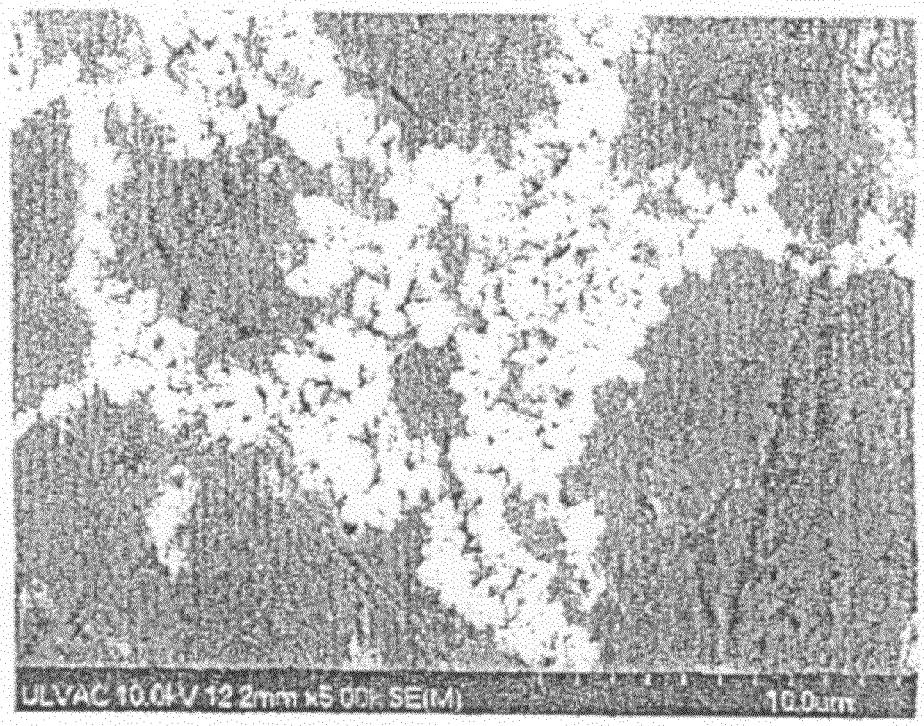
FIG. 6 is a SEM photograph showing raw material adhered onto a source gas feed line of a prior art MOCVD apparatus.

As shown in Table 1, the most adhesion of MPA was with the Ni chip. This seems to be because of the catalysis that nickel has. As for the bare sample of SUS316L, adhesion of MPA was recognized along grain boundaries (referring to FIG. 6). The SUS316L-EP chip treated with electrolytic polishing can reduce the mass of adhesion of MPA in comparison with the bare sample of SUS316L. However, the adhesion of MPA was recognized along a processing trace of the surface of the SUS316L-EP chip. As for the sample covered with TiN film, considerably more adhesion of MPA was recognized in comparison with the bare sample of SUS316L.

Figure 4A:
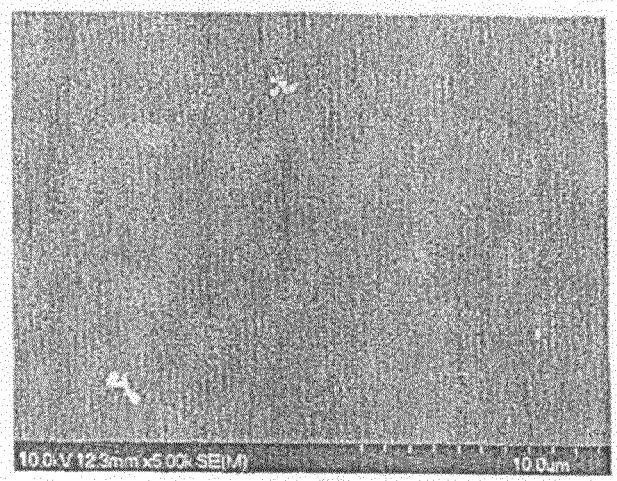
FIGS. 4A and 4B are SEM photographs showing examples of this invention, FIG. 4A being a sample of polyurea film having thickness of 100 nm and FIG. 4B being a sample of polyurea film having a thickness of 300 nm.
Figure 4B:
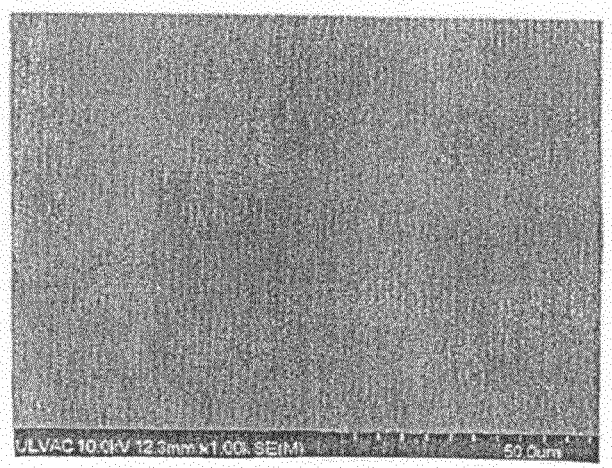

As for the sample covered with the polyurea film, difference of the weight (mass of adhesion of MPA) between before and after exposure to MPA is very small. FIG. 4A shows a SEM picture of the sample in which the thickness of the polyurea film is below 100 nm and FIG. 4B shows a SEM picture of the sample in which the thickness of the polyurea film is 100 nm.

When the thickness of the polyurea film is 50 nm or 100 nm, adhesion of MPA is partially recognized. Especially, mass of the adhesion is large when the thickness of the polyurea film is small. The reason for this is that a bare chip of SUS316L is used as a ground material for the polyurea film. Accordingly it seems that the adhesion of MPA can be restrained by improving surface roughness of the ground material with electrolytic polishing process, even if the thickness of the polyurea film is 100 nm.

On the other hand, as for the sample covered with the polyimide film, the difference of the weight before and after exposure to MPA is few. Accordingly it was ensured that the prevention effect of adhesion of MPA is very high. Further, when the thickness of the polyimide film is small, the prevention effect of the adhesion can be obtained. The reason for this is that the coverage characteristic of polyimide film on the surface of stainless steel is high. However, a polyimide film has such characteristics as a high hygroscopic property in comparison with a polyurea film and therefore the polymerization temperature (baking temperature) is high.

As above described, it is verified that the adhesion of MPA (organic metal compound) is effectively restrained by coating a polyurea film or a polyimide film on the surface of stainless steel. Therefore, as for a film forming apparatus such as MOCVD apparatus, adhesion of a source gas is restrained, and the source gas can be supplied in stability for a long time, and occurrence of particle can be prevented, by forming the resin coating to a source gas feed line of the apparatus.

While the preferred embodiments of the Invention have been described, without being limited to this, variations thereto will occur to those skilled in the art within the scope of the present inventive concepts that are delineated by the following claims.

For example, in the above embodiments a polyurea film and a polyimide film were raised in example as a resin coating, but it is not limited to this. Further, a monomer vapor is not limited to a mixed vapor composed of two kinds of monomers and a resin coating may be formed by using a single monomer vapor known as polymer evaporation technique.

Further, in the above embodiments two kinds of monomer vapors of MDA and MDI were used as mixed monomers vapor for vapor deposition polymerization. But the mixed vapor may be composed of three or more kinds of monomer vapors. For example, in the above embodiments alkaline raw material monomer (MDA) and acidic raw material monomer (MDI) were used in order to form the polyurea film and the polyimide film, but one or both of the monomers may be composed of two or more kinds of raw monomers.

Further, in the above embodiments a vacuum valve, a vaporizer and a pipe member were raised in example as a component for a vacuum apparatus, but this invention can be applied to other components such as a bubbler and coupling components.

Further still, in the above embodiment MOCVD apparatus was explained as a film forming apparatus, but this invention can be applied to thermal CVD apparatus, plasma CVD apparatus or other film forming apparatus except for CVD apparatus.

The invention claimed is:
1. A vacuum film forming system comprising:
  a film forming chamber for depositing a metal layer onto a substrate;
  a liquid raw material feed line connected with a closed vessel storing a liquid raw material of the metal layer, the liquid raw material feed line including a first valve;
  a source gas feed line connected between the first valve and the film forming chamber, the source gas feed line including;
  a vaporizer for vaporizing the liquid raw material and forming a source gas;
  a pipe member for supplying the source gas to the film forming chamber, the pipe member connected between the vaporizer and the film forming chamber; and
  a second valve connected between the pipe member and the film forming chamber; and
  a resin coating forming apparatus including:
  a supply unit for supplying a monomer vapor;
  a vacuum pumping line connected between the supply unit and a connecting point between the first valve and the vaporizer on the liquid raw material feed line;
  a third valve placed on the vacuum pumping line;
  a temperature adjusting unit for forming a resin coating by depositing the monomer vapor onto an internal flow path of the source gas feed line;

an exhaust line connected between the pipe member and the second valve on the source gas feed line, for exhausting the monomer vapor fed to the source gas feed line; and a fourth valve placed on the exhaust line;

wherein when the resin coating is formed onto the internal flow paths of the source gas feed line, the first valve and the second valve are closed and the third valve and the fourth valve are opened, whereby the monomer vapor is introduced to the source gas feed line from the supply unit and the monomer vapor is exhausted through the exhaust line, and wherein when the metal layer is formed onto the substrate, the first valve and the second valve are opened and the third valve and the fourth valve are closed, whereby the source gas is supplied to the film forming chamber.

2. A vacuum film forming system according to claim 1 in which the supply unit includes:

a plurality of evaporation sources for evaporating plural kinds of resin material monomers for the deposition polymerization; and a mixing tank for mixing the plural kinds of resin material monomers.

3. A vacuum film forming system according to claim 1 in which the resin coating is made of polyurea or polyimide.

4. A vacuum film forming system according to claim 1 in which the liquid material is organic metal complex in the liquid state for MOCVD.

* * * * *